United States Patent
Krijn et al.

(10) Patent No.: US 6,455,848 B1
(45) Date of Patent: Sep. 24, 2002

(54) PARTICLE-OPTICAL APPARATUS INVOLVING DETECTION OF AUGER ELECTRONICS

(75) Inventors: Marcellinus Petrus Carolus Michael Krijn; Alexander Henstra, both of Eindhoven (NL)

(73) Assignee: Koninkijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/464,008

(22) Filed: Dec. 15, 1999

(30) Foreign Application Priority Data

Dec. 17, 1998 (EP) .................................. 98204289

(51) Int. Cl.$^7$ ..................... G01N 23/00; G21K 7/00; H01J 37/153
(52) U.S. Cl. ..................... 250/310; 250/396 R
(58) Field of Search ................... 250/305, 310, 250/396 R, 396 ML, 492.2, 309, 492.21

(56) References Cited

U.S. PATENT DOCUMENTS

| | | | |
|---|---|---|---|
| 4,789,787 A | * 12/1988 | Parker | 250/396 R |
| 4,894,549 A | * 1/1990 | Stengl | 250/492.2 |
| 5,182,453 A | * 1/1993 | Hayashi | 250/309 |
| 5,422,486 A | 6/1995 | Herrmann et al. | 250/396 |
| 5,436,460 A | * 7/1995 | Stengl et al. | 250/492.21 |
| 5,444,243 A | * 8/1995 | Kohhashi et al. | 250/305 |
| 5,510,617 A | * 4/1996 | Troost et al. | 250/310 |
| 6,246,058 B1 | * 6/2001 | Tiemeijer | 250/396 R |
| 6,259,094 B1 | * 7/2001 | Nagai et al. | 250/310 |

FOREIGN PATENT DOCUMENTS

EP       0989584 A1    3/2000    ............ H01J/37/05

* cited by examiner

*Primary Examiner*—Jack Berman
*Assistant Examiner*—Johnnie L Smith, II

(57) ABSTRACT

In a SEM it is desirable, in given circumstances, to acquire an image of the sample (14) by means of Auger electrons extracted from the sample and traveling back through the bore of the objective lens (8) in the direction opposing the direction of the primary beam. It is known to separate extracted electrons from the primary beam by positioning Wien filters (32, 34) in front of the objective lens (8), the filters being energized in such a way that they do not cause deflection of the primary beam but do deflect the secondary electrons. This technique cannot be used for Auger electrons, considering their high energy and hence much stronger fields in the Wien filters, thus causing substantial imaging aberrations in the primary beam.

According to the invention a quadrupole field is applied in the same position as the fields of each Wien filter (32, 34, 36), thus ensuring that the resolution of the image of the sample (14) is not degraded by the fields of the Wien filters.

8 Claims, 6 Drawing Sheets

PARTICLE-OPTICAL APPARATUS INVOLVING DETECTION OF AUGER ELECTRONICS

FIELD OF THE INVENTION

The invention relates to a particle-optical apparatus which includes:
- a particle source for producing a primary beam of electrically charged particles which travel along an optical axis of the apparatus,
- a sample holder for a sample to be irradiated by means of the apparatus,
- a focusing device for forming a focus of the primary beam in the vicinity of the sample holder,
- at least two Wien filters which are arranged between the particle source and the focusing device.

The invention also relates to a method of separating electrically charged particles according to direction of movement in such a particle-optical apparatus as will be described in detail hereinafter.

DESCRIPTION OF PRIOR ART

A particle-optical apparatus of this kind is known from U.S. Pat. No. 5,422,486.

Devices in which a focusing primary electron beam is moved across the sample to be examined are known as scanning electron microscopes (SEM). In a SEM an area of a sample to be examined is scanned by means of a focused primary beam of electrically charged particles, generally being electrons which travel along an optical axis of the apparatus. The energy of the primary electron beam in the SEM can vary within a wide range in dependence on the application. This value may lie between limits of the order of magnitude of 1 kV and 30 kV, but higher or lower values are not precluded.

During irradiation of the sample to be examined, electrically charged particles (usually electrons) are released in the sample. These electrons may have an energy which varies from a very low value to a value which is of the same order of magnitude as the energy of the primary beam, for example from 10% to practically 100% thereof. The energy of the low-energy released electrons has a value of the order of magnitude of from 1 to 50 eV; in that case they are called secondary electrons. The energy of the high-energy released electrons has a value of the order of magnitude of from 50 eV up to the energy value of the primary beam; in that case they are called backscatter electrons. The range of the Auger electrons, whose energy values lie between approximately 50 eV and 5 keV, lies within and is superposed on the gradually varying energy spectrum of the backscatter electrons. In the energy spectrum of the backscatter electrons such Auger electrons cause a slight intensity variation in the relevant energy range; this variation may be considered as a ripple which is superposed on the gradually varying background of the backscatter electrons. The location and the magnitude of the maximum values in said ripple are characteristic of the material in the sample. In order to detect the energy variation of the Auger electrons, use can be made of special, known Auger detectors which are capable of separating the spectrum of the Auger electrons from the spectrum of the backscatter electrons.

The energy and/or the energy distribution of the released electrons provides information as regards the nature and composition of the sample. These electrons are released at the side of the sample at which the primary beam is incident, after which they travel back against the direction of incidence of the primary electrons. When one or more Wien filters are arranged in the path of the secondary electrons thus traveling back, these electrons then pass through these filters in a direction which opposes the direction of the primary beam; moreover, the energy of these released electrons will deviate from the energy of the primary beam. Consequently, the released electrons are deflected away from the optical axis, so away from the primary beam, so that further deflection means can conduct these electrons to a detector without noticeably influencing the primary beam. The further deflection means according to the cited U.S. patent document consist of an electron mirror which is arranged between the electron source and the focusing device and to the side of the optical axis. An energy selected image of the sample is thus realized in known manner. With a view to the quality of the imaging of the electron source to a scan spot, it is necessary that the Wien filters do not noticeably disturb the primary beam; it is notably necessary that the dispersion of these Wien filters does not enlarge the scan spot of the primary beam (in which the electrons inevitably exhibit a given energy spread) focused on the sample. In the cited patent document this is achieved by utilizing two Wien filters, the second Wien filter canceling the dispersion caused by the first Wien filter.

The known particle-optical apparatus is arranged to produce images by means of secondary electrons, i.e. electrons which are released from the sample and whose energy lies between approximately 1 eV and 50 eV. However, it is often also desirable to form an image by means of released electrons of a different energy, for example Auger electrons whose energy may be, for example a factor of one hundred higher than the energy of the secondary electrons. In that case the electric and magnetic fields of the Wien filters must become proportionally stronger; such greater strength is inevitably accompanied by imaging defects which would inadmissibly affect the spot size of the focus primary beam and hence degrade the resolution of the image.

SUMMARY OF THE INVENTION

It is an object of the invention to provide a particle-optical apparatus of the kind set forth in the introductory part of claim 1 in which Auger images of the sample can be formed without seriously degrading the spatial resolution by the selection of the Auger energy range. To this end, the particle-optical apparatus according to the invention is characterized in that for each Wien filter there are provided means for generating a quadrupole field, which means are situated at the area of the respective Wien filter in such a manner that at least a part of each of the quadrupole fields coincides with the field of the associated Wien filter.

A sharp spot of the primary beam can thus be obtained such that the desired resolution is maintained. Notably the astigmatism caused by the Wien filters is thus reduced. Because of the described situation of the quadrupole fields, the quadrupole strength can be varied without at the same time necessitating adjustment of the strength of one or both fields of the Wien filters.

It would in principle be feasible to attempt and realize the desired correction of the imaging defects of the Wien filters by means of the stigmators which are already included in an electron microscope in order to correct astigmatism of the electron lenses which, after all, also produce a type of quadrupole field. These stigmators, however, are designed to make small corrections so that they do not have a suitably defined pole surface. This means that the correct location relative to the optical axis of the relevant stigmator fields is not defined well enough, so that the corrective effect in combination with the Wien filters cannot be suitably predicted and, moreover, the image may wander far from the optical axis upon variation of the stigmator energizing ("drifting away" of the image). A more serious drawback, however, is that a difference in magnification occurs between the x-z plane and the y-z plane because the position of the stigmator along the optical axis deviates from that of the Wien filter; upon formation of the scan spot by the imaging of the electron source, this difference can readily lead to a ratio of 2:3 of the angle of aperture of the primary beam at the area of the sample. This means that, for example the image defect due to spherical aberration of the objective (known to be proportional to the third power of said angle of aperture) exhibits a ratio of 8:27 of said x-z planes and said y-z planes, so that the circular symmetry of the scan spot, and hence the resolution of the microscope, would be seriously disturbed.

Three Wien filters are arranged between the electron source and the focusing device in an embodiment of the particle-optical apparatus according to the invention. In this configuration the angular spread caused by the dispersion of the first Wien filter (viewed from the electron source) is canceled by the subsequent second Wien filter. Due to the distance between the first and the second filter, however, the electrons of different energy in the primary beam are then subject to a given lateral shift so that in given circumstances the desired image resolution can no longer be achieved. In cases where this is objectionable, a third Wien filter can be arranged behind the second Wien filter. The second Wien filter is then energized to a slightly higher degree, so that the electrons of different energy coincide again in the third Wien filter. Due to the dispersive effect of the third filter, these electrons are deflected through such different angles that they do not exhibit a resultant angular variation, and hence no resultant transverse shift, upon departure from the filter.

In a further embodiment of the particle-optical apparatus according to the invention, the means for generating a quadrupole field are formed by two additional electrons which are arranged parallel to the optical axis and extend perpendicularly to the electrodes for generating the electrical field in the Wien filter.

The two electrodes which extend perpendicularly to the electrostatic electrodes and parallel to the optical axis can be formed by the pole faces for generating the magnetic field, provided that these faces are electrically insulated from the remainder of the apparatus. It is alternatively possible to provide separate electrically conductive electrodes on these pole faces; these electrodes are in that case secured to the pole faces via an electrically insulating intermediate layer. The above steps can be readily implemented in this embodiment, for example by adjusting the power supply source (sources) of the relevant Wien filter in such a manner that, in addition to the supply of a pure voltage difference, relative to a common zero level, to the field electrodes (+V and −V relative to zero volts), the two additional electrodes are connected to a common voltage. As a result of this step, no additional physical means will be required so as to generate the desired quadrupole field and, moreover, the center of the quadrupole field will always coincide with the center of the Wien filter field. In these circumstances the correction of the lens defects due to the filter will be optimum.

Another embodiment of the particle-optical apparatus according to the invention is provided with deflection means for deflecting electrically charged particles from the sample further away from the optical axis, which deflection means are connected between the electron source and the focusing device and to the side of the optical axis, and are arranged to generate a substantially radial electrical deflection field. This step enables a comparatively simple construction of the deflection system; moreover, not only a cylinder-symmetrical deflection field but also a spherical-symmetrical deflection field is thus possible. This offers the advantage that use can be made of comparatively long deflection electrodes with a comparatively small spacing without the electron beam striking the plates. For a given deflection angle, a comparatively low voltage then suffices on said electrodes.

In a further embodiment of the particle-optical apparatus according to the invention the deflection means are also arranged to generate a magnetic deflection field and to adjust the magnetic deflection field and the electrical deflection field independently of one another. These steps yield a flexible instrument which has focusing properties in dependence on its setting. A point of the sample which emits Auger electrons can thus be imaged as well as possible on the entrance surface of the detector, so that the Auger detector can offer a favorable spectral resolution.

The invention also relates to a method for separating electrically charged particles in a particle-optical apparatus according to direction of travel, in which apparatus there is produced a primary beam of electrically charged particles which travel along an optical axis of the apparatus, the primary beam passes through a Wien filter which is arranged between the particle source and the focusing device, the focusing device forms an end focus of the primary beam in the vicinity of a sample holder for a sample to be irradiated by means of the apparatus, electrically charged particles are released from the sample in response to the incidence of the primary beam, which released particles travel in the direction opposing the direction of travel of the primary beam, said released particles are deflected away from the primary beam in the Wien filter.

According to a further aspect of the invention, the desired formation of Auger images of the sample without seriously degrading the spatial resolution due to the choice of the Auger energy range can also be achieved by means of only one Wien filter; this benefits the simplicity of the particle-optical apparatus.

In order to achieve the foregoing object, said method according to the invention is characterized in that an intermediate focus of the primary beam is formed substantially at the center of the Wien filter, and that at the area of the Wien filter there is generated a quadrupole field, at least part of which coincides with the field of the Wien filter.

The effect of the Wien filter on the primary beam is that a ray in this primary beam which has an energy other than the nominal energy (i.e. the energy at which no resultant deflection is caused by the filter) is deflected by the filter. This deflected ray appears to emanate substantially from one point at the center of the filter, viewed from the exit of the filter, so that this point becomes a virtual object point for the imaging elements succeeding the filter, notably the objective which focuses the beam on the sample. When the intermediate focus of the primary beam is positioned in said virtual object point, the objective unites all rays emanating from said object point in the associated image point again, irrespective of the angle enclosed relative to the optical axis by the rays emanating from said object point. Any angular variation in said object point due to the energy dispersion of the filter, therefore, does not cause a variation in the image point, so a variation of the size of the electron spot of the primary beam formed on the sample. Due to the choice of the location of the intermediate focus, therefore, the electron spot constitutes a dispersion-free image of said intermediate focus. This choice of the location of the intermediate focus also offers the advantage that any second and third Wien filters can be dispensed with, because apparently no dispersion is caused in the first filter, so that no Wien filters will be required either for correction thereof.

Advantageous versions of this method are defined in the dependent Claims.

BRIEF DESCRIPTION OF THE DRAWING

The invention will be described in detail hereinafter with reference to the Figures in which corresponding reference numerals denote corresponding elements. Therein.

DETAILED DESCRIPTION OF THE PREFERRED EMBODIMENTS

Figure 1:
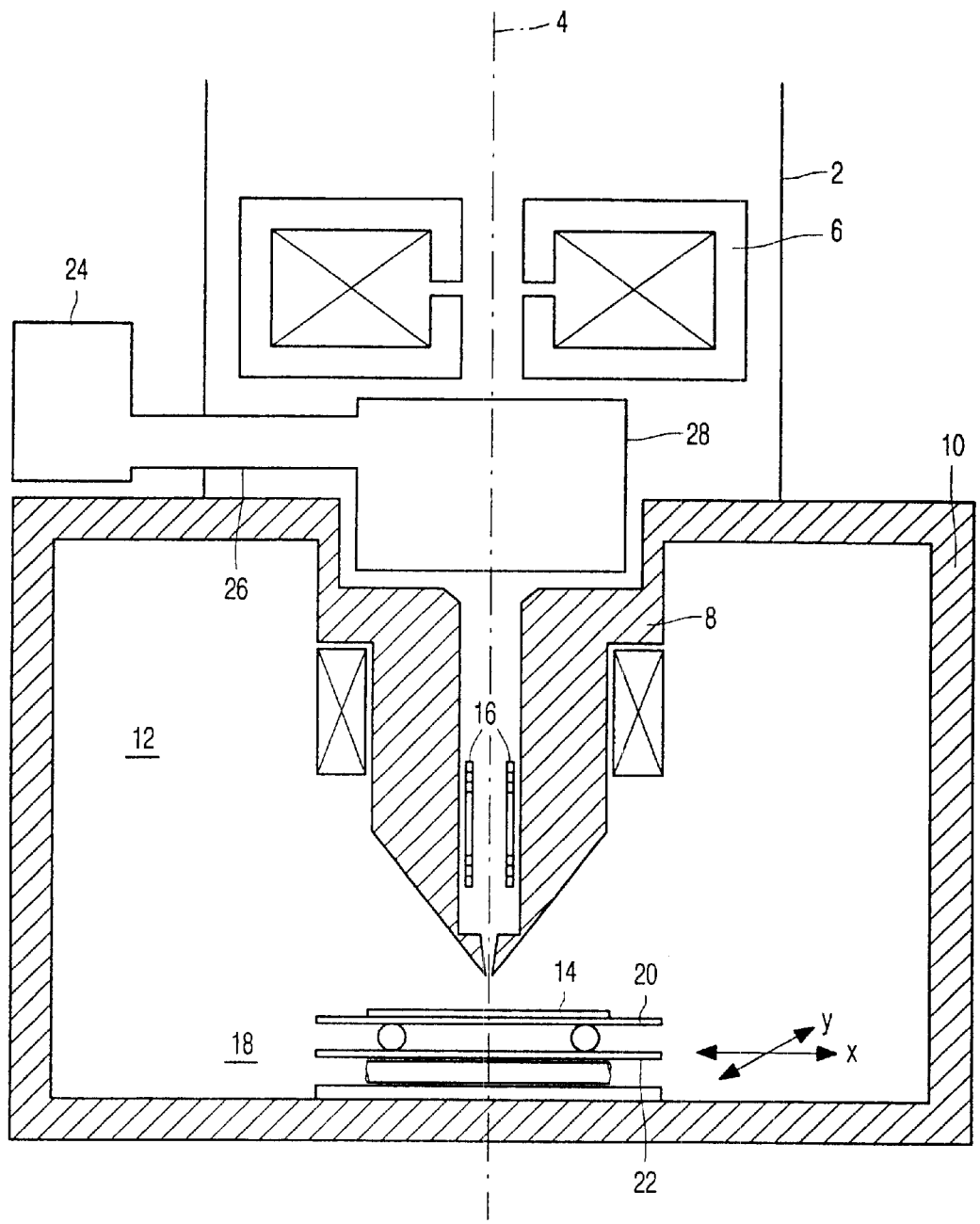
FIG. 1 shows diagrammatically a relevant part of a particle-optical instrument according to the invention.

FIG. 1 shows a particle-optical instrument in the form of a part of a column 2 of a scanning electron microscope (SEM). As is customary, in this instrument a beam of electrons (the primary beam) is produced by an electron source (not shown in the Figure); this beam travels along the optical axis 4 of the instrument. The electron beam may pass through one or more electromagnetic lenses, such as a condenser lens 6, and ultimately reaches the objective lens 8. This lens, being a so-called monopole lens, forms part of a magnetic circuit which also consists of the wall 10 of the sample chamber 12. The objective lens 8 is used to form a focus by means of the primary electron beam in order to scan the sample 14. The sample is scanned by moving the electron beam across the sample, in the x direction as well as the y direction, by means of scan coils 16 which are accommodated in the objective lens 8. The sample 14 is arranged on a sample holder 18 which includes a carrier 20 for the x displacement and a carrier 22 for the y displacement. These two carriers enable selection of a desired area of the sample for examination. The objective 8 thus serves as a focusing device for realizing a focus of the primary beam in the vicinity of the sample holder 18. In the present microscope imaging is realized in that electrons are struck loose from the sample and travel back in the direction of the objective lens 8. Because the objective lens is constructed as a monopole lens, the released electrons travel in the magnetic field of the objective, so that they move in the direction of the acute, downwards pointing end of the objective where they enter the bore of the objective. These electrons are subsequently separated from the primary beam in a Wien filter unit 28 yet to be described, after which the released electrons are deflected further away from the optical axis 4 and towards a detector 24 by means of deflection means 26 yet to be described. The deflection means 26 are arranged between the electron source and the objective lens 8, acting as the focusing device, and to the side of the optical axis 4. A control unit (not shown) is connected to the detector in order to activate the detector and to convert the flow of detected electrons into a signal which can be used for forming an energy-selected image of the sample, for example by means of a cathode ray tube (not shown).

Figure 2A:
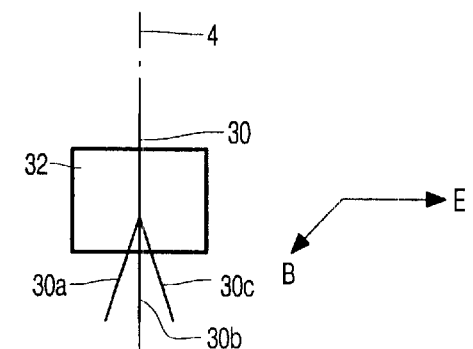
FIGS. 2a, 2b, 2c show the course of some electron paths in one or more Wien filters as used in an electron microscope according to the invention.
Figure 2B:
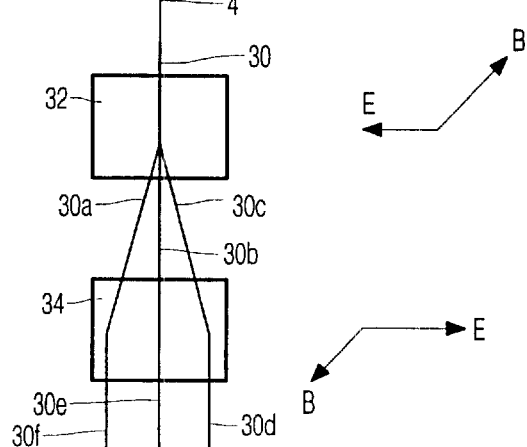
Figure 2C:
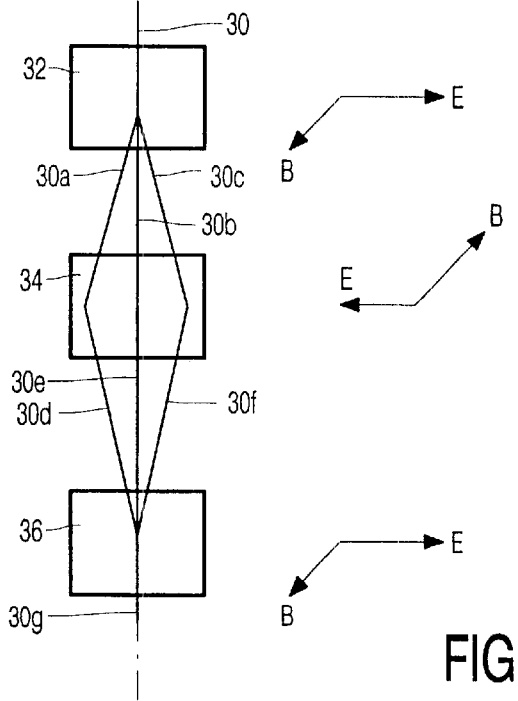

The FIGS. 2a, 2b and 2c illustrate the effect of one or more Wien filters on the primary beam. As is known, the effect of a Wien filter on an electron beam is such that the path of electrons of an energy associated with the setting of the filter (the nominal energy) is not deflected by the filter, whereas the path of electrons of an energy higher than the nominal energy is deflected in one direction and that of electrons of an energy lower than the nominal energy is deflected in the other direction. This effect is illustrated in FIG. 2a in which the primary electron beam 30 is incident, along the optical axis 4, on the diagrammatically represented Wien filter 32. It is assumed that the electron beam 30 consists of electrons of three different energies, i.e. the nominal energy $E_n$, a lower energy $E_l$ and a higher energy $E_h$. Arrows drawn adjacent the Wien filter indicate the direction of the magnetic field B (perpendicular to the plane of drawing) and the electrical field E (in the plane of drawing) in the Wien filter 32. It appears that, after having passed the Wien filter 32, the primary beam is split into a sub-beam 30a of the lower energy, a sub-beam 30b of the nominal energy, and a sub-beam 30c of the higher energy.

In FIG. 2b a second Wien filter 34 is added to the filter 32. It is to be noted that the fields E and B in the filter 32 oppose the corresponding fields in the filter 32 shown in FIG. 2a whereas the fields of the filter 34 are equally large as but oppose those of the filter 32. As a result, the sub-beams 30a, 30b and 30c are deflected by the filter 34 in such a manner that they emanate again parallel to the original direction of incidence of the beam 30, that is to say as the beams 30d, 30e and 30f.

In FIG. 2c a third Wien filter 36 is added to the filters 32 and 34. It is to be noted that the fields E and B in the filter 32 have the same direction as the corresponding fields in the filter 32 shown in FIG. 2a whereas the field directions of the filter 34 oppose those of the filter 32. In FIG. 2c slightly stronger fields are adjusted for the filter 34 in comparison with FIG. 2b. As a result, the sub-beams 30a, 30b and 30c are deflected by the filter 34 in such a manner that they are directed towards the center of the filter 36 again as sub-beams 30d, 30e and 30f. In the latter filter the sub-beams are subject to a deflection which opposes that in the filter 34, so that the sub-beams thus united emanate from the filter 36 as one beam again.

Figure 3:
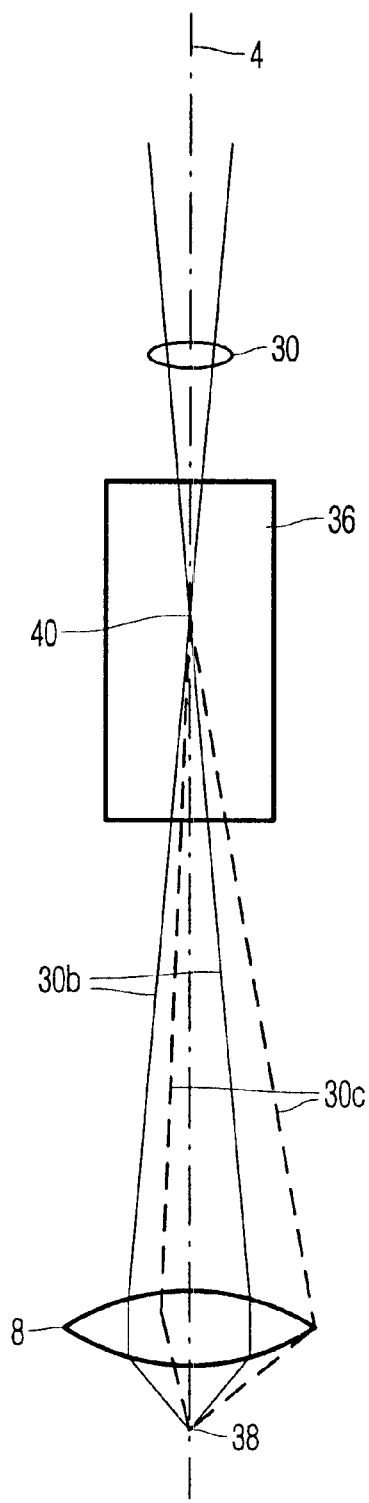
FIG. 3 shows the course of some electron paths in a Wien filter and an objective lens while utilizing an intermediate focus in the Wien filter according to the invention.

FIG. 3 shows the course of a converging electron beam 30 which travels along the optical axis and is incident on the Wien filter 36. The convergence of this beam has been chosen to be such that the union point 40 of this beam (the intermediate focus) is situated halfway in the filter. Electrons in the primary beam which have an energy deviating from the nominal energy are deflected by the filter and leave the filter as a sub-beam 30c. Viewed from the exit of the filter, this sub-beam appears to emanate from the intermediate focus 40, so that this point becomes an object point for the objective lens 8 which succeeds the filter and focuses the beam on the sample. As a result, all rays emanating from said intermediate focus are united again in the associated image point 38 by the objective, irrespective of the angle enclosed relative to the optical axis by the rays emanating from the intermediate focus. Any angular variation in the intermediate focus due to the deflecting effect of the filter, therefore, does not change the location of the image point, so the size of the electron spot formed on the sample by the primary beam. As a result of this choice of the location of the intermediate focus, the electron spot constitutes a dispersion-free image of said intermediate focus.

Figure 4:
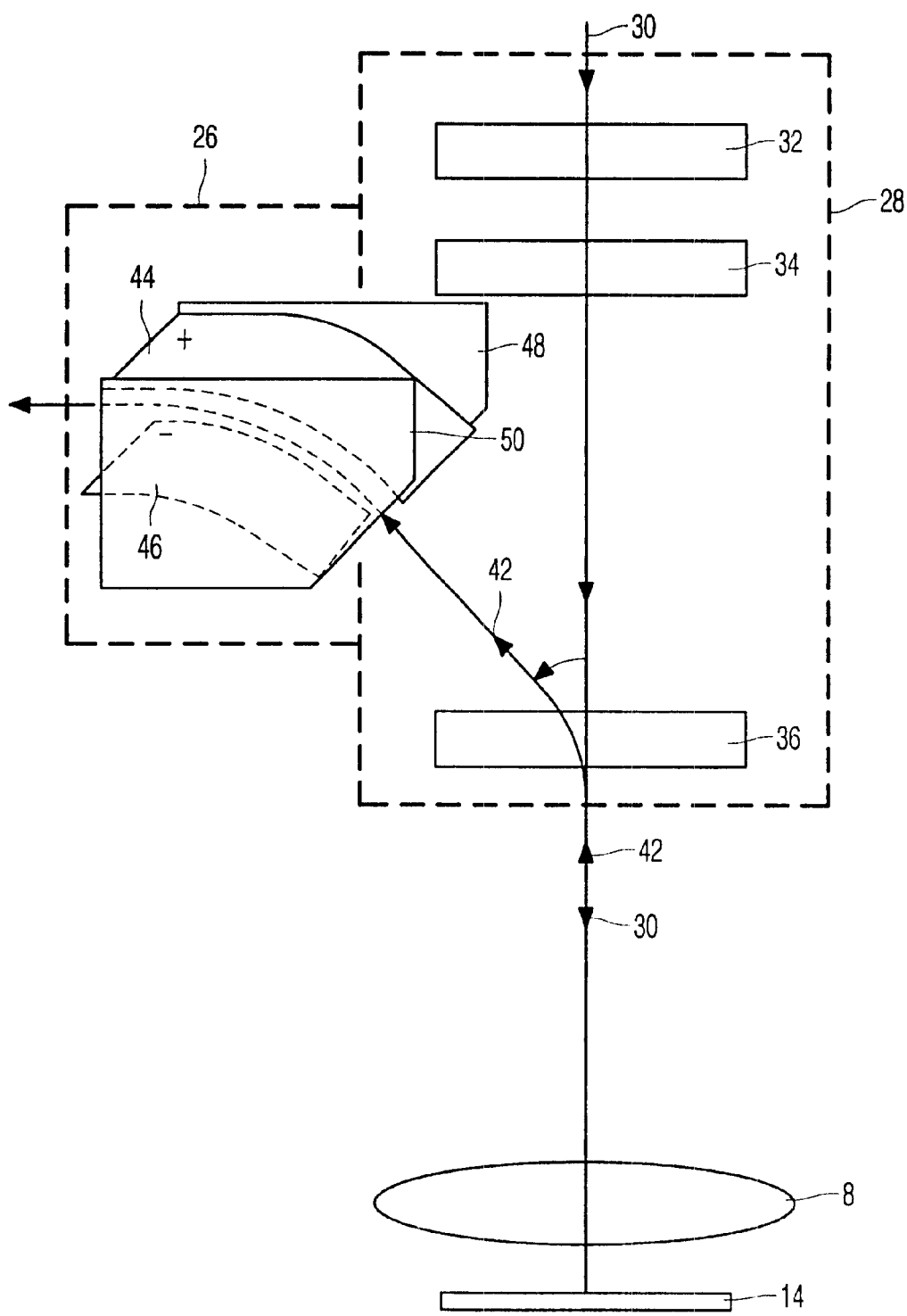
FIG. 4 shows the path of a primary electron and an electron released from the sample in a system of Wien filters and an objective lens.

FIG. 4 shows the course of the path 30 of a primary electron through a system 28 which consists of Wien filters 32, 34 and 36 and an objective lens 8. This Figure also shows the path 42 of an electron which is released from the sample and successively traverses the objective lens 8, the lower Wien filter 36 of the system 28, and the deflection means 26.

As has already been described with reference to FIG. 2c, the primary electron beam 30 overall is not influenced by the Wien filters in the system 28. Due to the incidence of the primary beam 30, focused by the objective 8, on the sample 14, electrons of various energies are released in the sample, including notably Auger electrons whose energy is of the order of magnitude of from 50 eV to 5 keV. These Auger electrons are capable of traveling in the direction of the objective, notably when the objective is constructed as an immersion lens, i.e. a lens where the sample is situated in the magnetic field of the lens. In that case practically all Auger electrons travel, via the bore of the objective 8 (not shown in FIG. 4), against the direction of travel of the primary beam, i.e. in the direction of the lower Wien filter 36. Because the Auger electrons travel against the direction of the primary beam and, moreover, generally have an energy which is lower than that of the primary beam, these electrons do not satisfy the Wien condition for non-deflected passage of the filter, so that the Wien filter 36 deflects these electrons more or less away from the optical axis, along a path 42, in dependence on their energy. After the Auger electrons have thus been spatially separated from the primary beam 30, they are conducted further in the direction of an Auger detector (not shown) by the deflection means 26.

The deflection means 26 consist of electrodes 44 and 46 for generating an electrical field and magnet poles 48 and 50 for generating a magnetic field. The electrodes 44 and 46 extend perpendicularly to the plane of drawing. They have a substantially circular cylindrical shape so that the intersection with the plane of drawing constitutes a circle. The deflection means 26 are thus arranged to generate a substantially radial electrical deflection field. The pole faces of the magnet poles 48 and 50 extend parallel to the plane of drawing so that the magnetic field of the deflection means 26 extends substantially perpendicularly to the plane of drawing. The electrical deflection field and the magnetic deflection field are preferably mutually independently adjustable, so that selection of each of the field strengths enables selection of a desired energy range from the Auger electrons for a desired deflection direction.

Figure 5A:
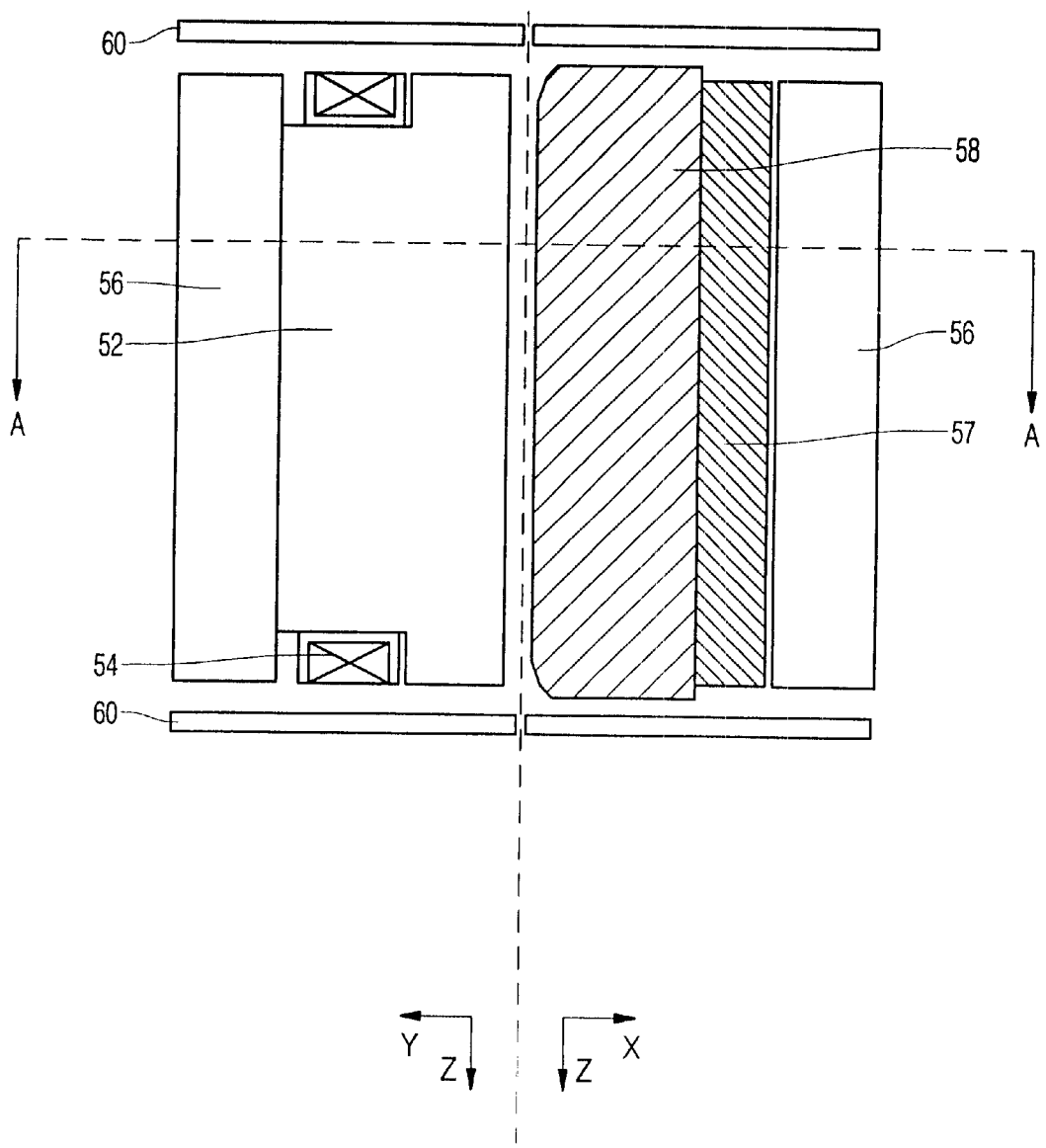
FIG. 5a is a diagrammatic sectional view, taken partly in the x-z plane and partly in the y-z plane, of a combination consisting of a Wien filter and means for generating a quadrupole field according to the invention.

FIG. 5a is a sectional view, taken partly in the x-z plane and partly in the y-z plane extending perpendicularly thereto, of the combination of a Wien filter and means for generating a quadrupole field as is to be used in the Wien filter unit 28 according to the invention. The Wien filter consists of two pole pieces 52 (only one of which is shown in FIG. 5a) which are made of nickel iron in order to produce the uniform magnetic field; a coil 54 is provided on each pole piece. The magnetic field generated by the coils 54 and the pole pieces 52 is conducted by a magnetic circuit 56 of nickel iron. This circuit is shaped as a cylinder whose axis coincides with the optical axis 4. Two electrodes 58 (only one of which is shown in FIG. 5a) are provided between the magnet poles 52 in such a manner that the pole faces of the electrodes 58 extend perpendicularly to the pole faces of the magnetic pole pieces 52. All of said pole faces extend parallel to the optical axis 4. The electrodes 58 are electrically insulated from the other metal parts of the Wien filter by an insulator 57.

At the top as well as at the bottom of the Wien filter there is provided a conductor (60 and 61, respectively), in the form of a circular plate provided with a central bore. Because these plates 60 and 61 are made of nickel iron, they can serve as a field termination for the electrical field as well as for the magnetic field of the Wien filter.

The electrodes 58 include a rounded portion at their top as well as at their bottom. As a result, the variation of the electrical field and the magnetic field of the Wien filter will become the same to a high degree, also at the ends thereof, so that the Wien condition for non-deflection of the electrons of nominal energy will be satisfied also at the ends of the fields.

Figure 5B:
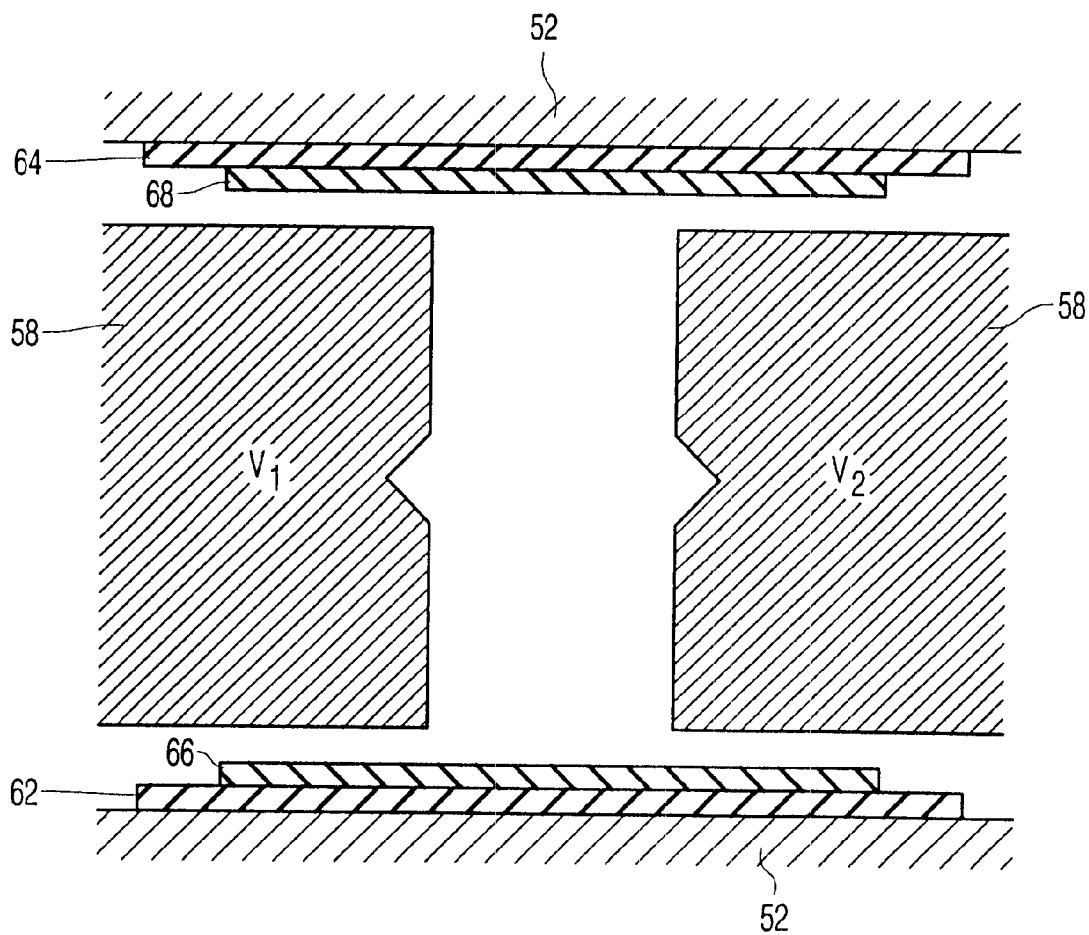
FIG. 5b is a more detailed (partial) sectional view, taken along the line A—A in FIG. 5a, of the correction device according to the invention.

FIG. 5b is a detailed representation of a partial sectional view of the Wien filter, taken along the line A—A. The electrodes 58 are arranged between the two magnet poles 52 in such a manner that the pole faces of these electrodes extend perpendicularly to the pole faces of the magnetic pole pieces 52. At the center of each of the electrodes 58 there is provided a V-shaped groove which extends parallel to the optical axis. Such a groove enhances the homogeneity of the electrical field. Electrical electrodes 66 and 68 are provided on each of the pole faces of the magnetic pole pieces 52, via a substrate layer 62 and 64, respectively, of an electrically insulating material. Each of said two electrodes may be supplied with its own voltage. The desired electrostatic quadrupole field can be generated by way of a suitable choice of these voltages. The desired homogeneous electrical field for the Wien filter effect is formed by applying a given potential difference to the electrodes 58 and by keeping the electrodes 66 and 68 at potential zero. The same potential, other than zero, can now be applied to the two electrodes 66 and 68. The effect of this potential, other than zero, is that the Wien filter shown exhibits, in addition to the Wien filter effect, the effect of an electrostatic lens and of a quadrupole field. If necessary, said (weak) lens effect can be readily compensated by slightly adapting the strength of the objective.

It is also possible to omit the insulators 62 and 64 and the electrodes 66 and 68 completely and to apply the desired electrical potentials to the pole pieces 52 instead. In that case the pole pieces should be electrically insulated from their environment.

What is claimed is:

1. A particle-optical apparatus which includes:
   a particle source for producing a primary beam of electrically charged particles which travel along an optical axis (4) of the apparatus,
   a sample holder (20) for a sample (14) to be irradiated by the primary beam,
   a focusing device (8) for forming a focus of the primary beam having a plurality of energy levels in the vicinity of the sample holder (20),
   at least two Wien filters (34, 36) which are arranged between the particle source and the focusing device (8), wherein means (58, 66, 68) for generating a quadrupole field, said means being arranged at an area of each of the respective said at least two Wien filters so that at least a part of each respective quadrupole field coincides with a field of the associated Wien filter.

2. A particle-optical apparatus as claimed in claim 1, in which three Wien filters (32, 34, 36) are provided between the particle source and the focusing device (8).

3. A particle-optical apparatus as claimed in claim 1, in which the means for generating a quadrupole field are formed by two additional electrodes (66, 68) which are arranged parallel to the optical axis and extend perpendicularly to the electrodes (58) for generating the electrical field in the Wien filter.

4. A particle-optical apparatus as claimed in claim 1, provided with deflection means (26) for deflecting electrically charged particles from the sample (14) further away from the optical axis (4), which deflection means are connected between the electron source and the focusing device (8) and to the side of the optical axis (4), and are arranged to generate a substantially radial electrical deflection field.

5. A particle-optical apparatus as claimed in claim 4, in which the deflection means (26) are also arranged to generate a magnetic deflection field and to adjust the magnetic deflection field and the electrical deflection field independently of one another.

6. A method for separating electrically charged particles in a particle-optical apparatus according to direction of travel, in which apparatus providing a primary beam of electrically charged particles from an electron source which travel along on an optical axis (4) of the apparatus, arranging a Wien filter (36) and a focusing device (8) in the optical axis of the primary beam, the focusing device (8) forming an end focus of the primary beam in the vicinity of a sample holder (20) for a sample (14) to be irradiated by the primary beam, wherein electrically charged particles are released from the sample (14) in response to the incidence of the primary beam on the sample, said released particles travel in the direction opposing the direction of travel of the primary beam, wherein said released particles are deflected away from the primary beam in the Wien filter (36), and wherein an intermediate focus (40) of the primary beam is formed substantially at the center of the Wien filter (36), generating a quadrupole field at an area of the Wien filter, at least part of which coincides with a field of the Wien filter.

7. A method as claimed in claim 6, in which the released particles are deflected further away from the optical axis (4) by deflection means (26) which are arranged between the particle source and the focusing device (8) and to the side of the optical axis (4), said deflection in the deflection means taking place under the influence of a substantially radial electrical deflection field.

8. A method as claimed in claim 7, in which the deflection of the released particles away from the primary beam is also realized by means of a magnetic deflection field, and in which the magnetic deflection field and the electrical deflection field are adjustable independently of one another.

* * * * *